Jan. 23, 1968 J. G. F. BOUCHARD 3,365,629

CHOPPER AMPLIFIER HAVING HIGH BREAKDOWN VOLTAGE

Filed June 24, 1965

INVENTOR
Joseph G. F. Bouchard

BY Connolly and Hutz
ATTORNEYS

United States Patent Office 3,365,629

Patented Jan. 23, 1968

3,365,629

CHOPPER AMPLIFIER HAVING HIGH BREAKDOWN VOLTAGE

Joseph G. F. Bouchard, Manchester, N.H., assignor to Sprague Electric Company, North Adams, Mass., a corporation of Massachusetts Filed June 24, 1965, Ser. No. 466,576
2 Claims. (Cl. 317—235)

This invention relates to semiconductor devices and more particularly to transistors and diodes having high breakdown voltages and a method of making the same.

In the prior art, there is an undesirable limitation in voltage rating of semiconductor devices which employ diffused impurity regions. This limitation arises from the inherent density gradient of diffused regions, which generally makes impractical the achievement of low junction density necessary for high breakdown voltage.

Accordingly, in double diffused transistors, the emitter-base junction density or junction intercept is determined by the penetration of the diffused emitter within a diffused base region. Consequently, exceptional control of both diffused regions is required if a suitable low intercept is to be achieved.

Moreover, in such transistors, the emitter-base junction density is directly related to total base density. Thus, the reduction of the junction intercept adversely lowers the total base density desired for high punch through voltage and low base resistance.

In addition, the use of diffused regions in such devices necessitates the employment of costly isolation techniques and also fail to provide abrupt junctions.

It is an object of this invention to provide semiconductor devices which overcome the foregoing disadvantages.

Another object of this invention is to provide a semiconductor device having high breakdown voltage.

Still another object of this invention is to provide semiconductor devices having junctions approximating abrupt junctions.

An additional object of this invention is to provide a semiconductor having an isolating region of high conductivity contiguous with a region of opposite conductivity at the surface of the device.

A further object of this invention is to provide a method of fabricating semiconductor devices such as diodes and transistors having high breakdown voltage.

A still further object of this invention is to provide a method of constructing semiconductors having an isolating region of high conductivity contiguous with a region of opposite conductivity at the surface of the device.

These and other objects of this invention will become more apparent upon consideration of the following description taken together with the accompanying drawings in which.

In general this invention provides a semiconductor device having a substantially abrupt junction of low impurity density, this device comprises a body of semiconductor material of one conductivity type and a substantially homogeneous region of the other conductivity type contiguous with the body and forming a substantially abrupt junction of low density therewith.

Briefly, the process comprises the steps of forming a semiconductor wafer of one conductivity type, forming a homogeneous layer of the other conductivity type overlying the wafer, and isolating a portion of said layer to provide a substantially homogeneous region contiguous with said wafer.

Briefly, the preferred process, of constructing a dual emitter transistor in accordance with the invention, consists of first producing a thin epitaxial layer of silicon containing a homogeneous distribution of low N-type conductivity on a high conductivity P-type silicon substrate. A protective passivating layer of silicon dioxide is provided over a portion of the surface of the epitaxial layer. A P-type impurity such as boron is diffused into the epitaxial layer around residual silicon oxide to provide a P-type region in the epitaxial layer surrounding a homogeneous N-type pocket which is covered by the passivating silicon dioxide. Next, apertures are opened in the oxide and P-type emitter regions diffused into the N-type region. After reoxidation and opening a base aperture, a flash diffusion of phosphorus provides an N+ skin in the aperture for the reception of the base contact. Finally, contact areas are opened through the silicon dioxide for the emitters. In the product device the collector will be the P-type region surrounding the homogeneous N-type pocket. The collector contact is the P-type silicon substrate. The emitter and the base contacts are aluminum metallizations. Terminals or leads are bonded to the aluminum contacts and the device is suitably incapsulated.

Figure 1:
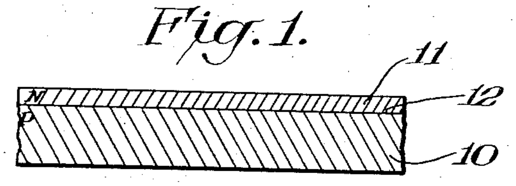
FIGURES 1–6 are schematic sectional diagrams illustrative of the method of fabricating a dual emitter transistor as the preferred embodiment of this invention.

Referring to the figures, FIGURE 1 shows a P-type substrate 10 having a layer 11 of N-type monocrystalline semiconductor material epitaxially grown on its upper surface. The layer 11 is provided with a homogeneous distribution of N-type impurities to provide a relatively constant resistivity throughout its volume. An epitaxial PN junction 12 is formed between the substrate 10 and the epitaxial layer 11.

Figure 2:
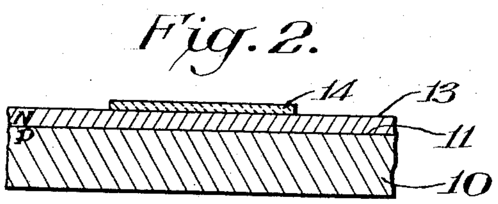

Next a silicon dioxide protective passivating layer is provided over a surface 13 of the layer 11 and then by a suitable technique such as a photo-resist procedure the oxide is removed to leave a residual mask protective layer 14 positioned on surface 13, as shown in FIGURE 2. Boron or other suitable P-type impurity is diffused into the exposed areas of surface 13 around the protective layer 14 to a depth equal to or greater than the epitaxial layer thickness. The diffusion is carried on at an elevated temperature and simultaneously there is effected a diffusion of P-type material across the PN junction 12 from the substrate 10 into layer 11.

Figure 3:
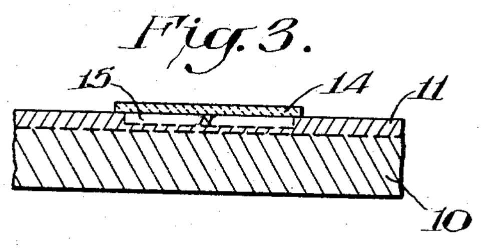

This movement of the junction 12 is dependent upon the relative density of the adjacent junctions, such that, the junction moves in the direction of the lower impurity region which in the described embodiment is layer 11. The upward diffusion penetrates substantially less than the total thickness of the epitaxial layer 11 and as indicated in FIGURE 3 the indiffusion through the surface 13 is substantially masked from penetrating beneath the protective layer 14. A portion of layer 11 is converted from N-type conductivity to P-type conductivity by the indiffusion but a pocket of the N-type epitaxial layer 11 remaining as a substantially homogeneous N-type region 15.

At this stage, an NP junction, approximating an abrupt junction, exists between the pocket of substantially constant resistivity, region 15 and the surrounding P-type material. As would be obvious to one skilled in the art, a diode of novel construction may be completed by connection of suitable terminals to each conductivity region.

Figure 4:
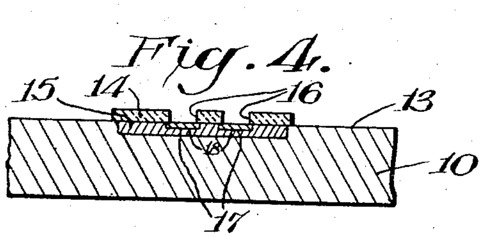

Advantageously, for completion of a transistor, apertures 16 as shown in FIGURE 4 are opened in the oxide layer 14. These apertures 16 are formed by suitable selective etching of the oxide to lay bare portions of the surface 13 over the region 15. P-type impurities are suitably diffused into the N-type region 15 through the apertures 16 to form a pair of P-type regions 17. These P-type regions each form a PN junction 18 with the N-type region 15. Now, since the regions 17 have high impurity concentration at the surface and a decreasing impurity gradient with penetration, common to all diffused regions, a low junction density is easily achieved within the substantially constant resistivity region 15. Thus, the junction density is primarily determined by the conductivity level of region 15 rather than by the comparative penetration of the emitter and base as in double diffused devices. It should also be appreciated that the total base area, of the novel device, as compared to the prior art, may be made larger and in any case is less sensitive to emitter penetration.

Figure 5:
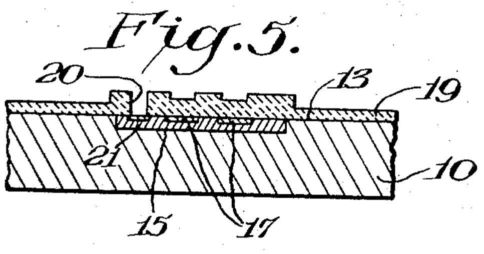
Figure 6:
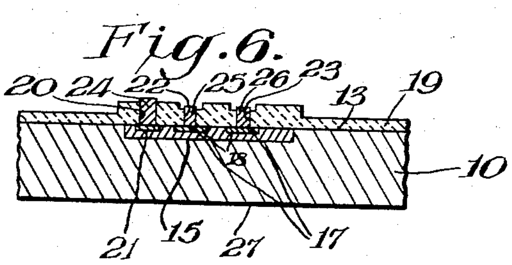

As shown in FIGURE 5, the surface 13 is reoxidized with a second silicon dioxide layer 19. The layer 19 is thinner than the original layer 14 with which it combines. An aperture 20, opened through the combined layers 14 and 19 by suitable etching, extends to the surface 13, over the region 15, at a point spaced away from the emitter regions 17. A flash diffusion of phosphorus produces a high concentration of electrons in a thin skin 21 in the region 15, at the aperture 20. This skin 21 serves to avoid the formation of a rectifying junction at the region 15 by a base contact later applied.

Next the emitter contact apertures are opened in the layers 14 and 19. The openings 22 and 23 for the emitter contacts are smaller than the diffused regions so as to minimize the migration of the aluminum contact material to the junctions 18. Aluminum is metallized all over the body 10 and then by suitable masking removed from all but the contact areas by etching off. Finally, in a sintering step the metallizations are formed into permanent ohmic contacts 24, 25 and 26. Terminals, not shown, are bonded to the base contact 24 and emitter contacts 25 and 26. The substrate 10 is the collector which is suitably electrically connected at any convenient point as represented by the connection 27.

Figure 7:
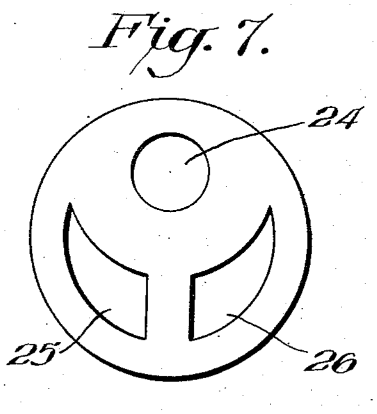
FIGURE 7 is a plan view of an embodiment of a dual emitter transistor of this invention showing an arrangement of terminal connections.

The substrate 10 shown in FIGURE 1, for example, may be a 0.001 ohm-cm. P-type material and the epitaxial layer 11 homogeneous 1 ohm-cm. N-type material grown to a thickness of 0.6 mil. The depth of the N-type region 15 is somewhat less than the 0.6 mil of the layer 11. The relative sizes of the base contact 24 and emitter contacts 25 and 26 are illustrated in the plan view of FIGURE 7. The collector contact of the substrate 10, not seen, covers an area of the outer circle shown in FIGURE 7.

The novel structure provides a substantially abrupt base junction of low junction density with both the collector and the emitter, since the base region has a substantially homogeneous impurity density of low concentration throughout. Thus, a low junction density or low impurity profile intercept, which is determined by either of the adjacent regions being of low conductivity, is determined, in this embodiment, by the base conductivity level and not by the penetration depth of any diffused region as in conventional double diffused devices. The abrupt junction is of course also inherent from the relatively constant resistivity or homogeneity of the base region.

High voltage ratings are achieved as a result of the indicated low junction density and a more reproducible capacitance versus voltage curve, as well as increased capacitance variation versus voltage, are derived from the abrupt junction characteristic.

A further advantage of low leakage is provided by the high conductivity portion of the collector contiguous with the perimeter of the base region at the surface of the device. This isolation region provides an economical means of eliminating the surface inversion layer while providing low collector to base capacitance.

As indicated, the isolating region is contiguous with, or in contact with, the periphery of the base region. This provides satisfactory isolation while still maintaining a low collector-base junction density since the base is a low conductivity region of substantially homogeneous impurity concentration.

Figure 8:
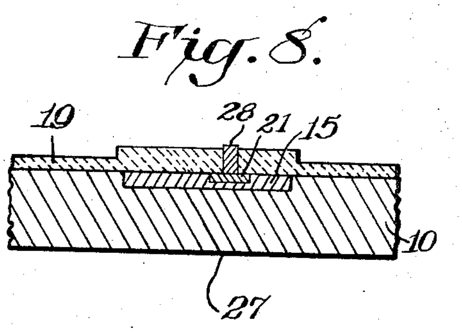
FIGURE 8 is a sectional view of a diode embodiment constructed in accordance with this invention.

The novel construction may also be utilized to provide a diode as shown in FIGURE 8. In this figure, an N-type region 15 is contiguous with and forms a junction within a P-type substrate 10. The structure is fabricated in a similar manner to that described for the transistor embodiment, with, however, the omission of the steps concerning the emitter.

Thus, as described earlier, an N-type layer is epitaxially formed over a P-type silicon substrate 10. A protective passivating layer of silicon dioxide is provided over a portion of the surface of the epitaxial layer. A P-type impurity such as boron is diffused into the epitaxial layer around residual silicon oxide to provide a P-type region in the epitaxial layer surrounding a homogeneous N-type pocket which is covered by the passivating silicon dioxide. The device is completed by diffusion of a suitable contact region 21 and the attachment of leads to region 15 and body 10.

Accordingly, the described construction provides a diode junction protected at the surface of the structure by an oxide coat and having a substantially abrupt, as well as low, impurity profile intercept. Thus, the construction provides devices having high breakdown voltage and improved capacitance versus voltage parameter and further permits the formation of a plurality of diodes, of either polarity, in the same substrate.

For example, a plurality of N-type homogeneous regions, isolated by high P-type conductivity and forming a junction with a common P-type substrate could be fabricated. Similarly, a device having P-type regions and an N-type substrate may also be formed. In addition, diodes of opposite polarity may also be constructed on the same substrate by diffusion of a further zone within one of the homogeneous regions.

Although, the invention has been described as regards a silicon P-type substrate and N-type epitaxial layer etc., it should be understood that appropriate substitution of conductivity type and semiconductor material may be made. Thus, germanium and intermetallic alloys may be utilized.

Indeed, many modifications are possible. For example, the homogeneous region may be isolated by other means such as by etching away a portion of the surrounding layer. Furthermore, a large number of the devices may be formed within a large substrate and subsequently diced up to provide the individual device as shown.

Moreover, although the preferred embodiment described a dual emitter device, it should be obvious to one skilled in the art that a single emitter may also be employed in practicing the invention. An additional improvement of the dual emitter transistor may be realized by forming an even number of emitter regions with alternate regions interconnected to provide two composite emitters whose characteristics are more nearly identical than those of individual dual emitters.

Thus, many modifications of this invention may be made without departing from the spirit and scope therein and it should be understood taht the invention is not to be limited except as defined in the appended claims.

What is claimed is:

1. A dual emitter transistor having a high breakdown voltage comprising a silicon wafer of P-type conductivity, scribed a dual emitter device, it should be obvious to one overlying said wafer, an isolating region having high P-type conductivity within said layer at the periphery thereof, said isolating region extending from the upper surface of said layer to said wafer to enclose a substantially homogeneous base region of substantially constant resistivity within said layer, said base region forming a single substantially abrupt base-collector junction of low density with said wafer and said isolating region, and two spaced apart P-type diffused emitter regions within said homogeneous low conductivity base region, each forming with said base region the same substantially abrupt junction of low density.

2. A dual emitter transistor having a high breakdown voltage comprising a silicon wafer of P-type conductivity, a substantially homogeneous low conductivity N-type layer overlying said wafer, an isolating region of high P-type conductivity within said layer at the periphery thereof, said isolating region extending from the upper surface of said layer to said wafer to enclose a substantially homogeneous base region of substantially constant resistivity within said layer, said base region forming a single substantially abrupt base-collector junction of low density with said wafer and said isolating region, a plurality of spaced apart P-type diffused emitter regions within said base regions, each of said emitter regions forming with said base region the same substantially abrupt junction of low density, a number of said emitter regions interconnected to provide a first emitter, and an equal number of the remaining emitter regions interconnected to provide a second emitter.

References Cited

UNITED STATES PATENTS

| | | | |
|---|---|---|---|
| 3,226,611 | 12/1965 | Haenichen | 317—234 |
| 3,275,910 | 9/1966 | Phillips | 317—235 |
| 3,275,912 | 9/1966 | Kunz | 317—235 |
| 3,299,329 | 1/1967 | Pollock | 317—235 |

JOHN W. HUCKERT, *Primary Examiner.*

M. H. EDLOW, *Assistant Examiner.*

UNITED STATES PATENT OFFICE
CERTIFICATE OF CORRECTION

Patent No. 3,365,629 January 23, 1968

Joseph G. F. Bouchard

It is hereby certified that error appears in the above numbered patent requiring correction and that the said Letters Patent should read as corrected below.

Column 4, line 19, after "21" insert -- , 28 --; line 60, for "taht" read -- that --; line 65, for "scribed a dual emitter device, it should be obvious to one" read -- a substantially homogenenous low conductivity N-type layer --; column 5, line 15, for "regions", first occurrence, read -- region --.

Signed and sealed this 18th day of March 1969.

(SEAL)
Attest:

Edward M. Fletcher, Jr.
Attesting Officer

EDWARD J. BRENNER
Commissioner of Patents